United States Patent
Sekiya

(10) Patent No.: US 10,170,379 B2
(45) Date of Patent: Jan. 1, 2019

(54) WAFER PROCESSING SYSTEM

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 250 days.

(21) Appl. No.: 15/042,621

(22) Filed: Feb. 12, 2016

(65) Prior Publication Data

US 2016/0240415 A1    Aug. 18, 2016

(30) Foreign Application Priority Data

Feb. 12, 2015  (JP) ................... 2015-025239

(51) Int. Cl.
*H01L 21/677*    (2006.01)
*H01L 21/66*     (2006.01)
*H01L 21/67*     (2006.01)
*H01L 21/673*    (2006.01)

(52) U.S. Cl.
CPC .......... *H01L 22/10* (2013.01); *H01L 21/6776* (2013.01); *H01L 21/67092* (2013.01); *H01L 21/67115* (2013.01); *H01L 21/67294* (2013.01); *H01L 21/67346* (2013.01); *H01L 21/67736* (2013.01)

(58) Field of Classification Search
CPC ....... B65D 85/38; B65D 85/86; H01L 21/673; H01L 21/67333; H01L 21/6734; H01L 21/67346; H01L 21/6773; H01L 21/67736; H01L 21/6779; H01L 21/68; H01L 21/78; H01L 21/301
USPC ............................................ 414/222.11, 284
See application file for complete search history.

(56) References Cited

U.S. PATENT DOCUMENTS 5,256,204 A * 10/1993 Wu ................... H01L 21/67276
                                                    118/719
5,641,054 A *  6/1997 Mori ................. H01L 21/67167
                                                    198/619
5,668,056 A *  9/1997 Wu ................... H01L 21/67017
                                                    29/25.01

(Continued)

FOREIGN PATENT DOCUMENTS

JP          60010640 A * 1/1985 ....... H01L 21/67778
JP          09-027543      1/1997

(Continued)

*Primary Examiner* — Saul Rodriguez
*Assistant Examiner* — Brendan P Tighe
(74) *Attorney, Agent, or Firm* — Greer Burns & Crain, Ltd.

(57) ABSTRACT

Disclosed herein is a wafer processing system for processing wafers one at a time, the wafer processing system including: a plurality of trays each configured to accommodate a wafer; a conveyor configured to transfer the wafers accommodated in the trays; first and second tray holding apparatuses arranged to be spaced from each other along the conveyor, the first and second tray holding apparatuses unloading the trays from the conveyor and loading the unloaded trays onto the conveyor; and first and second apparatuses provided for the first and second tray holding apparatuses, respectively, the first and second apparatuses including a processing unit configured to process the wafers transferred by the conveyor, and a loading/unloading unit configured to unload a wafer from or load a wafer onto one of the trays that is held by the first or second tray holding apparatus.

8 Claims, 10 Drawing Sheets

(56) References Cited

U.S. PATENT DOCUMENTS

| | | | |
|---|---|---|---|
| 8,500,388 B2* | 8/2013 | van der Meulen | B65G 25/02 414/805 |
| 2007/0002516 A1* | 1/2007 | Matsumoto | G03F 1/66 361/234 |
| 2008/0063496 A1* | 3/2008 | Bufano | H01L 21/67017 414/331.01 |

FOREIGN PATENT DOCUMENTS

| | | | | |
|---|---|---|---|---|
| JP | 2007012942 A | * | 1/2007 | G03F 1/66 |
| JP | 2014220523 A | * | 11/2014 | H01L 21/67376 |
| JP | 2016192582 A | * | 11/2016 | H01L 21/67376 |
| WO | WO-2005045920 A1 | * | 5/2005 | B65D 49/067 |
| WO | WO-2007133701 A2 | * | 11/2007 | H01L 21/67126 |

* cited by examiner

WAFER PROCESSING SYSTEM

BACKGROUND OF THE INVENTION

Field of the Invention

The present invention relates to a wafer processing system that can continuously subject each wafer to a series of processes including a machining step and a testing step.

Description of the Related Art

In a semiconductor wafer machining step such as a cutting step or a grinding step, a plurality of wafers (e.g., 25 wafers) are loaded into a cassette that is transferred between apparatuses on a cassette-by-cassette basis by operators to perform various steps (refer, for example, to Japanese Patent Laid-Open No. 1997-027543). In a grinding apparatus, a plurality of wafers are placed into a cassette with a protective tape affixed to the front faces thereof. The wafers are taken out of the cassette by a wafer transfer robot for grinding on the rear faces thereof. After the grinding, the plurality of wafers are placed into a different cassette by the wafer transfer robot.

In a cutting apparatus, on the other hand, a plurality of wafers are placed into a cassette in the form of wafer units, each of which is supported by an annular frame via a dicing tape. The wafers are taken out of the cassette by a loading/unloading apparatus one at a time for cutting, followed by cleaning, after which the wafers are placed into the same cassette by the loading/unloading apparatus.

SUMMARY OF THE INVENTION

It has been common to place a plurality of wafers into a cassette and take out the wafers one at a time for processing. If all wafers in the cassette have yet to be machined in the previous step despite the fact that a certain step is on standby where a next cassette can be loaded, this has led to a useless wait time, thus resulting in inefficiency. This inefficiency is unavoidable even if cassette transfer by operators is automated, for example, by transfer robots. Further, transfer of wafers one at a time between apparatuses by operators for efficiently performing the steps leads to an enormous increase in workload for the operators. This makes it inevitable to increase the number of operators, thus resulting in higher cost.

In light of the foregoing, it is an object of the present invention to provide a wafer processing system which permits reduction of useless wait time.

In accordance with an aspect of the present invention, there is provided a wafer processing system for processing wafers one at a time. The wafer processing system includes: a plurality of trays each configured to accommodate a wafer; a conveyor configured to transfer the wafers accommodated in the trays; first and second tray holding apparatuses arranged to be spaced from each other along the conveyor, the first and second tray holding apparatuses unloading the trays from the conveyor and loading the unloaded trays onto the conveyor; and first and second apparatuses provided for the first and second tray holding apparatuses, respectively. The first and second apparatuses includes processing means configured to process the wafers transferred by the conveyor; and loading/unloading means configured to unload a wafer from or load a wafer onto one of the trays that is held by the first or second tray holding apparatus.

Preferably, each of the first and second tray holding apparatuses has a first tray holding section configured to hold the tray and a second tray holding section configured to hold the tray, and the second tray holding section can unload or load one of the trays onto or from the conveyor while at the same time the first tray holding section is holding another tray.

The wafer processing system according to the present invention transfers wafers one at a time using a conveyor for supply to each apparatus, providing maximum reduction in useless wait time and permitting efficient processing of wafers with a small number of operators. The wafers are placed into trays and transferred with the conveyor, preventing wafer damage during transfer. Two tray holding sections are available with each of the tray holding apparatuses. This ensures that the tray holding apparatuses have a temporary tray storage function, thus providing another advantageous effect, namely, preventing the conveyor from coming to a halt and allowing for efficient supply of wafers to each apparatus.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
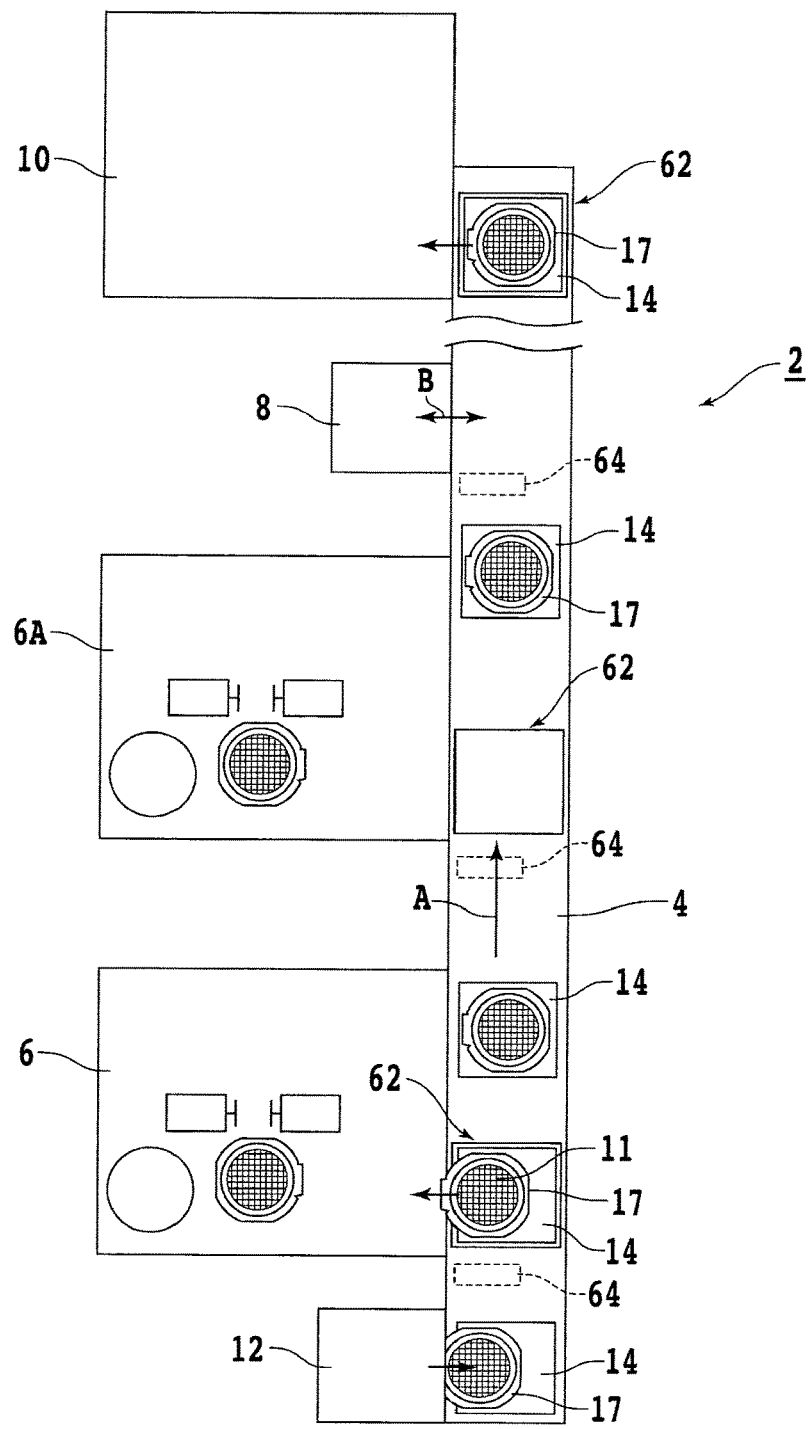
FIG. 1 is a plan view illustrating an overall configuration of a wafer processing system according to an embodiment of the present invention.

A detailed description will be given below of preferred embodiments of the present invention with reference to the accompanying drawings FIG. 1 shows a schematic plan view illustrating an overall configuration of a wafer processing system according to an embodiment of the present invention. A wafer processing system 2 includes a conveyor 4 such as a belt conveyor that moves in the direction shown by an arrow A. In the present embodiment, a first cutting apparatus 6, a second cutting apparatus 6A, a UV irradiator 8 configured to irradiate ultraviolet radiation, and a die bonder 10 are arranged to be spaced from each other along the conveyor 4. The first cutting apparatus 6, the second cutting apparatus 6A, the UV irradiator 8, and the die bonder 10 serve as first, second, third, and fourth apparatuses, respectively.

Figure 2:
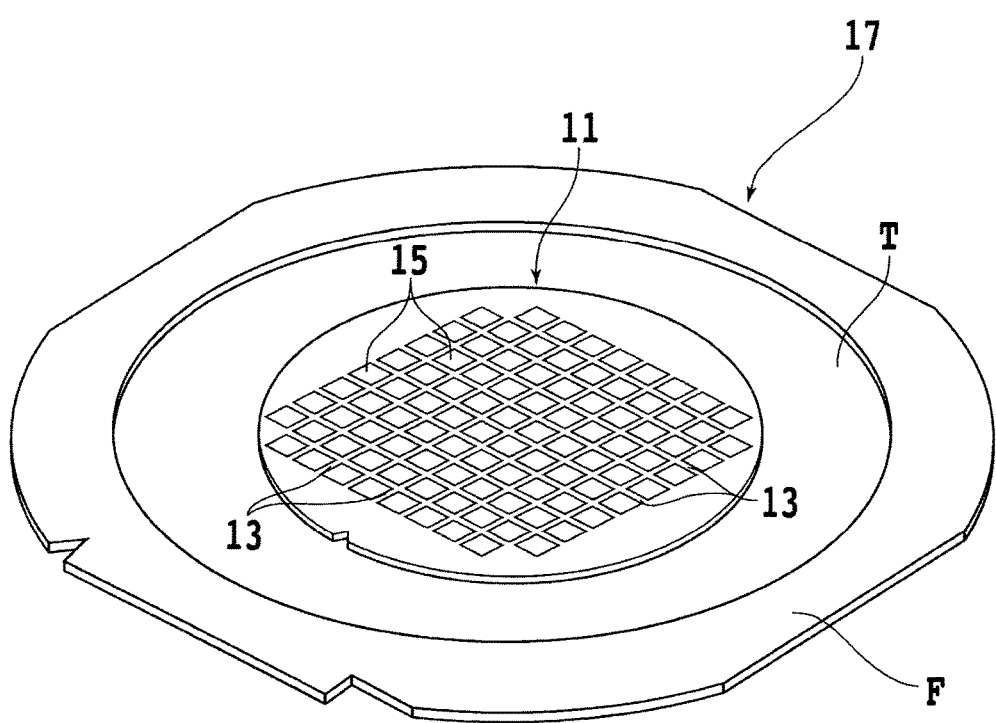
FIG. 2 is a perspective view of a wafer unit.

The embodiment shown in FIG. 1 schematically illustrates the arrangement of apparatuses in one embodiment of the wafer processing system of the present invention. The arrangement of apparatuses is not limited thereto. Any arrangement may be used so long as a plurality of apparatuses are arranged along the conveyor 4. The wafer processing system of the present embodiment is primarily made up of a cutting apparatus. Therefore, a wafer 11 is fed into the wafer processing system in the form of a wafer unit 17 that is supported by an annular frame F via a dicing tape T as illustrated in FIG. 2. A front face of the wafer 11 is partitioned into a plurality of areas by scheduled division lines 13 that are formed in a grid pattern, with a device 15 such as an IC or an LSI formed in each of the partitioned areas. A rear face of the wafer 11 is affixed to the dicing tape T whose peripheral portion is affixed to the annular frame F, thus forming the wafer unit 17.

In the present embodiment, the wafer 11 is fed into the wafer processing system in the form of the wafer unit 17. However, the present invention is not limited thereto. Instead, the wafer 11 may be fed alone depending on the embodiment of the wafer processing system. For example, if the wafer 11 is cut into halves or the edge of the peripheral portion thereof is trimmed, the wafer 11 may be fed alone into the wafer processing system. Alternatively, in the case of a wafer processing system primarily made up of a grinding apparatus and/or a polishing apparatus, the wafer 11 is fed into the wafer processing system with a protective tape affixed to the front face thereof.

Figure 3:
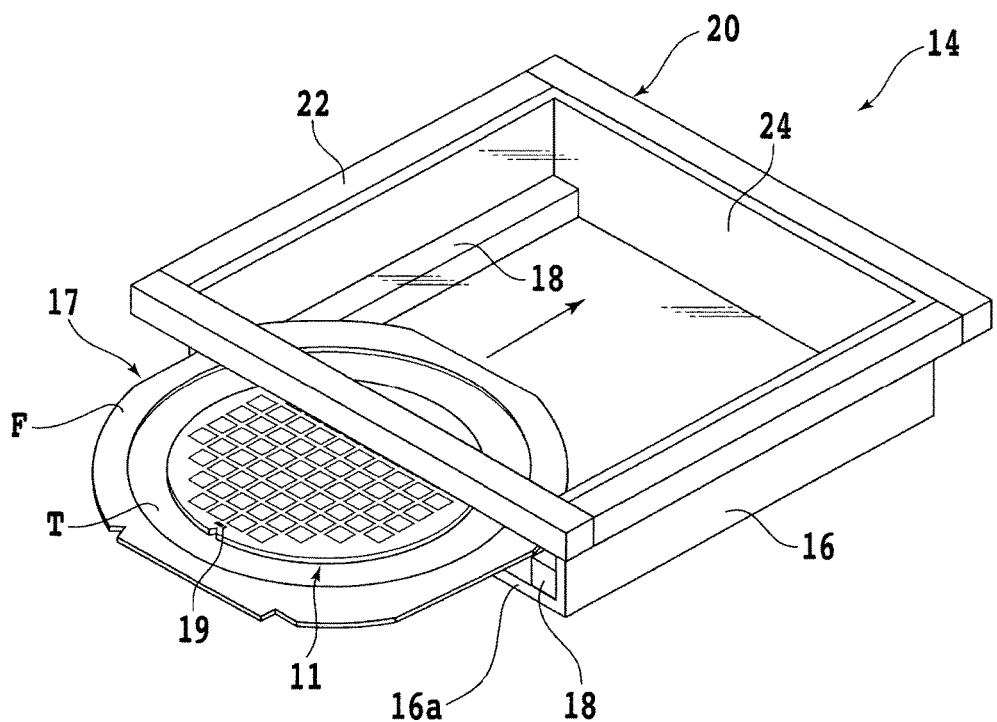
FIG. 3 is a perspective view illustrating the manner in which the wafer unit is placed into a tray.
Figure 4:
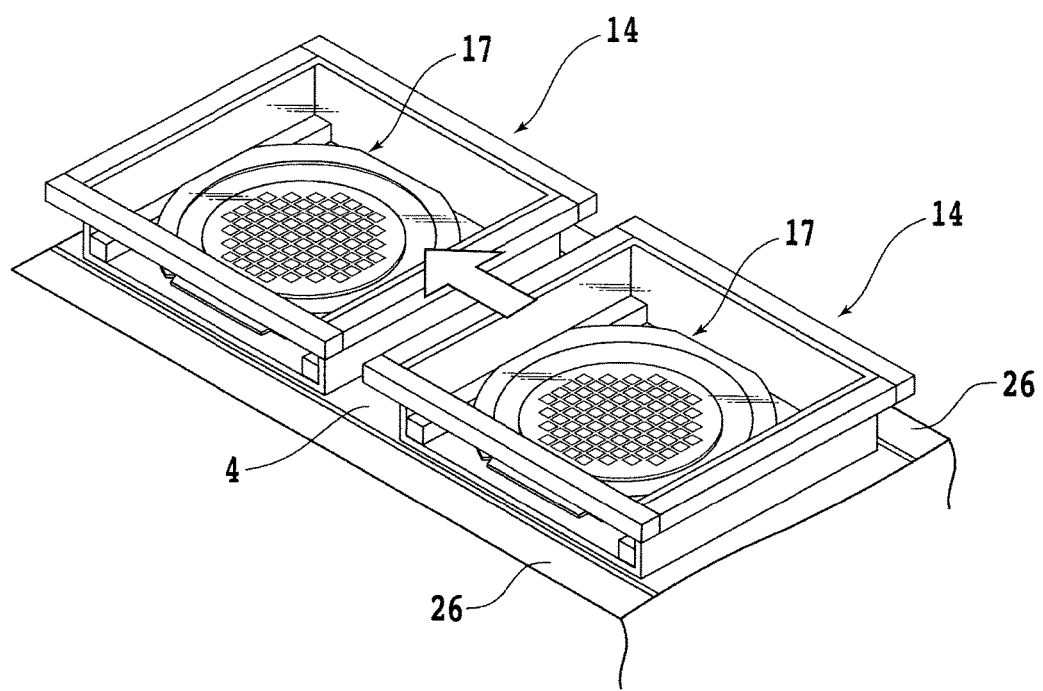
FIG. 4 is a perspective view of the plurality of trays transferred by a conveyor.

In the wafer processing system of the present embodiment, the wafer unit 17 is transferred by the conveyor 4 in a manner accommodated within a tray 14 as illustrated in FIG. 3. The tray 14 includes a case body 16 having a bottom plate 16a and a cover 20 that closes a top portion of the case body 16. A pair of support members 18 that support the annular frame F of the wafer unit 17 are fastened on top of the bottom plate 16a of the case body 16. The cover 20 includes a frame body 22 and a transparent cover member 24. The frame body 22 protrudes laterally a given distance from the case body 16. The cover member 24 is supported by the frame body 22 and formed with a transparent resin such as polycarbonate. A barcode 19 is affixed to the wafer 11 to be processed by the wafer processing system. The barcode 19 contains coded information such as details of the process performed on the wafer and sequence of machining steps.

Referring back to FIG. 1, the plurality of wafer units 17 are placed into a wafer feeding cassette 12 which is, in turn, placed into the tray 14 on the conveyor 4. Placement of the wafer units 17 into the tray 14 is accomplished preferably by automatically loading the wafer units 17 into the tray 14 on the conveyor 4 at a halt using a loader which is not shown. Alternatively, the tray 14 already loaded with the wafer units 17 may be placed on the conveyor 4 that is running. The wafer units 17 are placed into the tray 14 to prevent damage of any kind to the wafers 11 during transfer. The wafer units 17 accommodated in the tray 14 are placed on the conveyor 4 and transferred as the conveyor 4 runs.

A description will be given next of a configuration of the first cutting apparatus 6 with reference to FIG. 5. Reference symbol 28 represents a base of the first cutting apparatus 6. A chuck table 30 is arranged at an approximate center portion of the base 28. The chuck table 30 is rotatable and moved reciprocally in an X-axis direction by a machining feed mechanism which is not shown. A plurality of clamps (four clamps in the present embodiment) 32 are arranged around the chuck table 30 to clamp and fasten the annular frame F of the wafer unit 17. Reference symbol 34 represents a bellows that covers the machining feed mechanism of the chuck table 30.

A first gate-shaped frame 36 is arranged upright at a back portion on the base 28. The first gate-shaped frame 36 has first and second cutting units 38A and 38B that can move in Y- and Z-axis directions independently of each other. Guide rails 42 and 44 are fastened to a second gate-shaped frame 40 in such a manner as to extend in the Y-axis direction. The second gate-shaped frame 40 is arranged upright at a middle portion of the base 28. A first transfer unit 46 is mounted in such a manner as to be guided by the guide rail 42 and move in the Y-axis direction. A second transfer unit 54 is mounted in such a manner as to be guided by the guide rail 44 and move in the Y-axis direction.

The first transfer unit 46 includes a support member 48 and a suction section 50. The support member 48 is guided by the guide rail 42 to move in the Y-axis direction. The suction section 50 is in the shape of a cross and supported by the support member 48 in such a manner as to move in the Z-axis direction (vertically). The cross-shaped suction section 50 sucks the annular frame F of the wafer unit 17. A grip section 52 is attached to a tip of the cross-shaped suction section 50 to grip the annular frame F of the wafer unit 17. The second transfer unit 54 sucks and holds the wafer unit 17 that has undergone cutting, transferring the wafer unit 17 to a spinner cleaning unit 56.

Referring back to FIG. 1, tray holding apparatuses 62 are arranged for the first cutting apparatus 6, the second cutting apparatus 6A and the die bonder 10 such that the tray holding apparatuses 62 can move vertically in a stepwise manner. A description will be given of a detailed configuration of one of the tray holding apparatuses 62 with reference to FIGS. 6 to 9. The tray holding apparatus 62 accommodates the tray 14 and unloads or loads the wafer unit 17 from the tray 14 into or out of corresponding one of the first cutting apparatus 6, the second cutting apparatus 6A and the die bonder 10.

Figure 7:
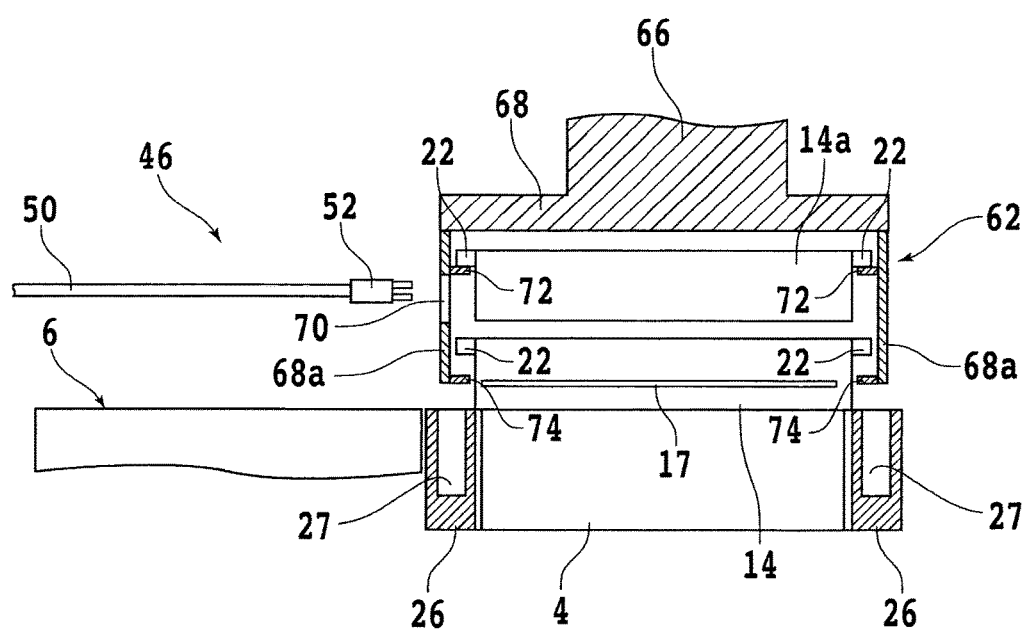
FIG. 7 is a sectional view of the tray holding apparatus with the tray accommodated therein.

The tray holding apparatus 62 includes a support section 66 and a tray holding apparatus main body 68. The support section 66 is moved vertically in a stepwise manner by a movement mechanism which is not shown. The tray holding apparatus main body 68 is supported by the support section 66. The main body 68 is widely open in the movement direction of the conveyor 4 as illustrated in FIG. 7, with a pair of side plates 68a formed to hang down. Although the movement mechanism of the support section 66 is not specifically shown, a known movement mechanism that uses a combination of an air cylinder or a ball screw and a pulse motor is applicable.

A first holding section 72 and a second holding section 74 are formed on each of the side plates 68a to hold the frame body 22 of the cover 20 of the tray 14. An opening 70 is formed in the side plate 68a opposed to the first cutting apparatus 6. The opening 70 is used to unload the wafer unit 17 from or load it into the tray 14 held by the first holding section 72 of the tray holding apparatus 62. As illustrated in FIGS. 6 to 9, an accommodation groove 27 is formed in an, area of each of a pair of rail members 26 which area corresponds to the tray holding apparatus 6. The rail members 26 are formed on both sides of the conveyor 4 to restrict the linear motion thereof. The accommodation grooves 27 permit downward movement of the tray holding apparatus 62.

In order to hold the trays 14 with the tray holding apparatus 62 of the present embodiment, the tray holding apparatus 62 is moved down to the lowermost position first, thus plating the side plates 68a of the tray holding apparatus 62 into the accommodation grooves 27 of the rail members 26. In this condition, the first holding sections 72 of the tray holding apparatus 62 are located at a slightly lower position than the frame body 22 of the cover 20 of the trays 14 that are transferred by the conveyor 4. When a sensor which is not shown detects that a tray 14, transferred by the conveyor 4, has been placed into the tray holding apparatus 62, the movement mechanism that moves the support section 66 vertically is activated, lifting the tray holding apparatus 62 to an intermediate position as illustrated in FIG. This allows the tray 14 to be held by the first holding section 72 inside the tray holding apparatus 62 as a first tray 14a. In this condition, the frame body 22 of the cover 20 of the trays 14 transferred by the conveyor 4 is located at a higher position than the second holding section 74.

Figure 9:
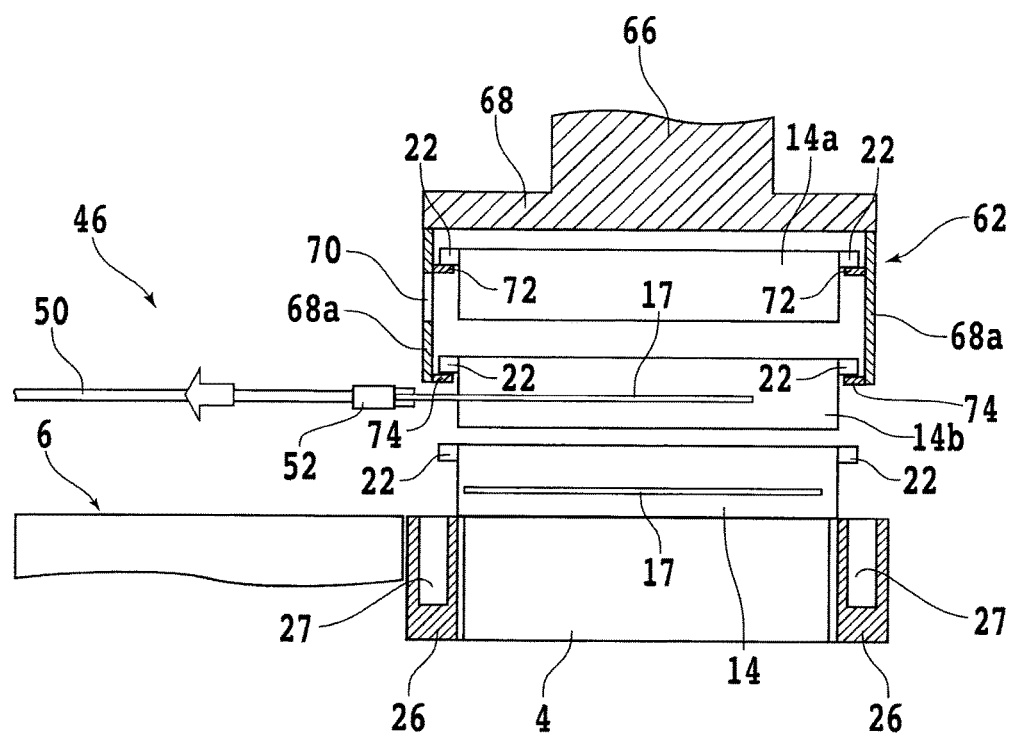
FIG. 9 is a vertical sectional view of FIG. 8.

Therefore, when the sensor detects that another tray 14 transferred by the conveyor 4 has been placed into the tray holding apparatus 62, the support section 66 of the tray holding apparatus 62 is lifted one step higher to a lifted position where the frame body 22 of the cover 20 of the tray 14 (a second tray 14b) is held by the second holding section 74 as illustrated in FIG. 9. When the tray holding apparatus 62 is at this lifted position, the trays 14 that are transferred by the conveyor 4 continue to be done so in an as-is manner. When the unshown sensor detects that a tray 14 has been placed into the tray holding apparatus 62, the conveyor 4 should preferably be halted. However, if the conveyor 4 runs at low speed, the tray holding apparatus 62 may be lifted one or two steps higher rather than halting the conveyor 4.

Referring back to FIG. 1, barcode readers 64 are arranged above the conveyor 4, one on the upstream side of the tray holding apparatus 62 opposed to the first cutting apparatus 6, another on the upstream side of the tray holding apparatus 62 opposed to the second cutting apparatus 6A, and still another on the upstream side of the UV irradiator 8. The barcode readers 64 read the barcodes 19 of the wafers 11. Whether to load the wafer units 17 from the tray 14 into the first or second cutting apparatus 6 or 6A for cutting is determined on the basis of information in the barcodes 19 of the wafers 11 read by these barcode readers 64.

If it is determined that there is no need to cut the wafer 11 using the first cutting apparatus 6 on the basis of the information of the barcode 19 of the wafer 11 read by the barcode reader 64, the tray 14 accommodating the wafer unit 17 in question is not loaded into the tray holding apparatus 62 opposed to the first cutting apparatus 6. Instead, the conveyor 4 is run so that the tray 14 accommodating the wafer unit 17 skips the first cutting apparatus 6.

Figure 5:
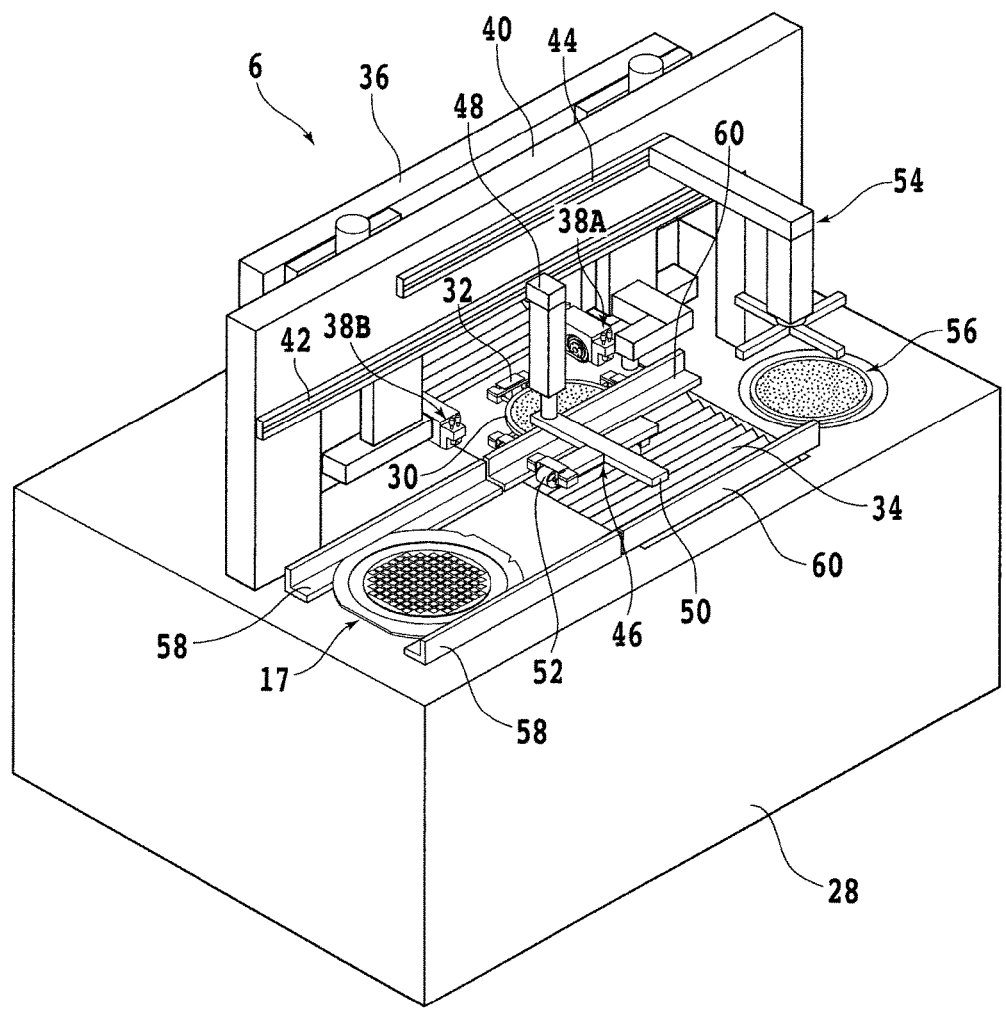
FIG. 5 is a perspective view of a cutting apparatus.

As illustrated in FIG. 5, a pair of first centering bars 58 are arranged on the base 28 of the first cutting apparatus 6. The first centering bars 58 simultaneously move in approaching and separating directions. A pair of second centering bars 60 are arranged above the bellows 34. The second centering bars 60 simultaneously move in approaching and separating directions. Thus, the centering bars 58 and 60 are arranged adjacent to each other because the path for drawing the wafer unit 17 from above the conveyor 4 onto the chuck table 30 of the first cutting apparatus 6 is long.

Figure 6:
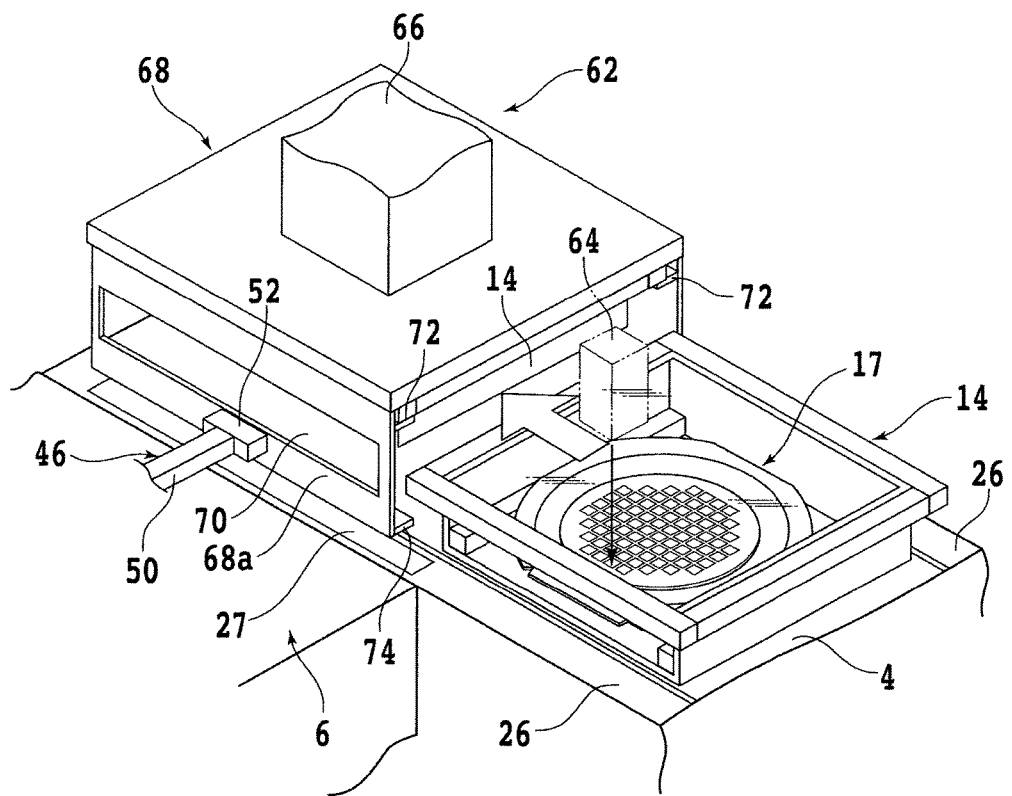
FIG. 6 is a perspective view illustrating the manner in which the tray is placed into a tray holding apparatus.

A description will be given below of the workings or operations of the wafer processing system according to the present embodiment described above. In the first cutting apparatus 6 illustrated in FIG. 5, the wafer unit 17 is placed on the first centering bars 58. In this condition, therefore, the wafer unit 17 in the first tray 14a held by the first holding section 72 has been gripped with the grip section 52 of the first transfer unit 46 and drawn into the first cutting apparatus 6 as illustrated in FIGS. 6 and 7. Therefore, the first tray 14a held by the first holding section 72 of the tray holding apparatus 62 is empty, and the tray holding apparatus 62 is lifted one step higher from the lowermost position.

Referring back to FIG. 5, the wafer unit 17 drawn in from the first tray 14a with the grip section 52 of the first transfer unit 46 slides on the first centering bars 58 to be positioned on the second centering bars 60 as the first transfer unit 46 is moved in the Y-axis direction. Here, the second centering bars 60 are moved in the approaching direction to center the wafer unit 17 first, and then the wafer unit 17 is sucked by the suction section 50 of the first transfer unit 46.

The second centering bars 60 are moved in the separating direction first, and then the chuck table 30 is moved to immediately under the wafer unit 17 that is sucked by the suction section 50 of the first transfer unit 46, after which the wafer unit 17 is placed on the chuck table 30. Next, the wafer 11 is sucked and held by the chuck table 30 via the dicing tape T, and at the same time, the annular frame F of the wafer unit 17 is clamped and fastened with the clamps 32. In this condition, the wafer 11 is cut using the first cutting unit 38A and/or the second cutting unit 38B, thus dividing the wafer 11 into individual device chips.

After the cutting of the wafer 11, the wafer unit 17 is sucked and held by the second transfer unit 54, moving the wafer unit 17 to the spinner cleaning unit 56. The wafer unit 17 is cleaned and dried by spinning using the spinner cleaning unit 56. Next, the wafer unit 17 is sucked by the suction section 50 of the first transfer unit 46, thus transferring the wafer unit 17 to the first centering bars 58. Then, the annular frame F of the wafer unit 17 is gripped with the grip section 52 of the first transfer unit 46. Then, the wafer unit 17 that has been subjected to cutting is inserted into the first tray 14a held by the first holding section 72 of the tray holding apparatus 62.

Figure 8:
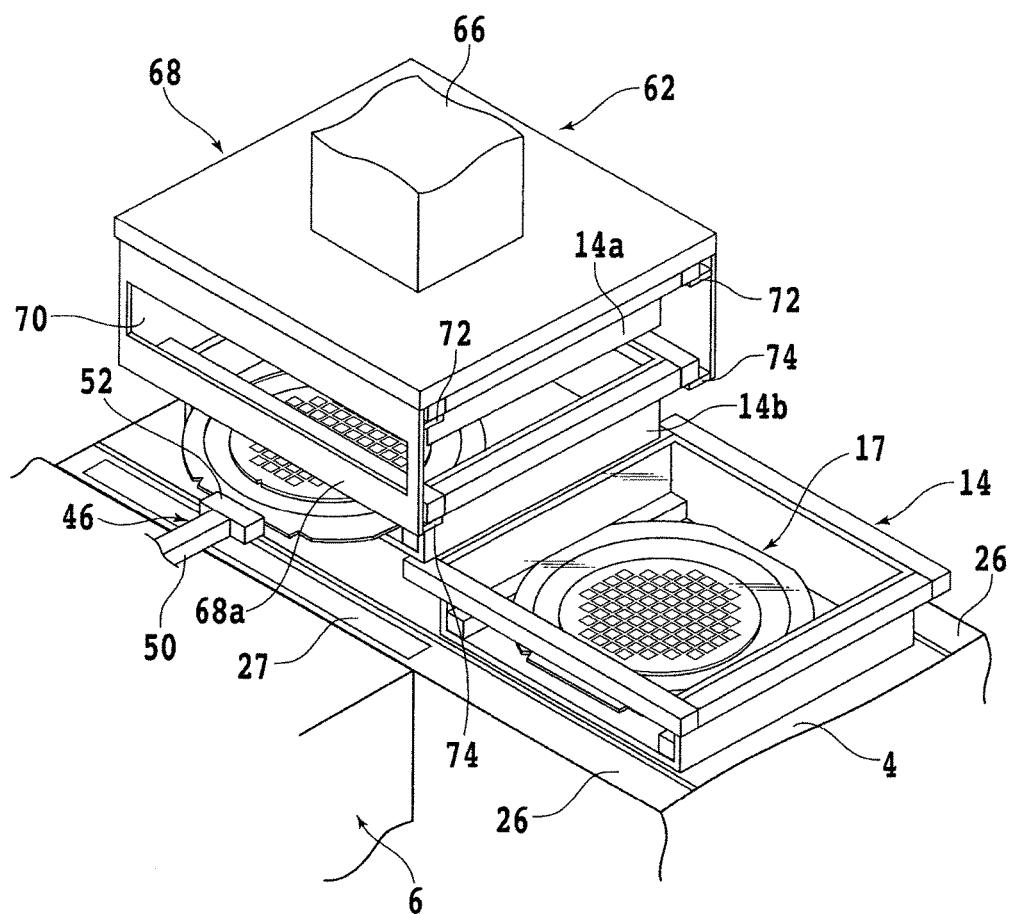
FIG. 8 is a perspective view illustrating the manner in which the wafer unit sticks out of the tray accommodated in the tray holding apparatus.

In order for the second holding section 74 to hold the second tray 14b transferred by the conveyor 4 when the first tray 14a is held by the first holding section 72 of the tray holding apparatus 62 as illustrated in FIGS. 6 and 7, the sensor detects first that the second tray 14b has been completely placed into the tray holding apparatus 62. Then, the tray holding apparatus 62 is lifted two steps higher from the lowermost position as illustrated in FIGS. 8 and 9 so that the second holding section 74 of the tray holding apparatus 62 holds the second tray 14b. In this condition, there is enough space between the second tray 14b held by the tray holding apparatus 62 and the trays 14 transferred by the conveyor 4. This ensures that the trays 14 transferred by the conveyor 4 pass by the tray holding apparatus 62 without no interference with the second tray 14b held by the tray holding apparatus 62.

In order to load the wafer unit 17 from the second tray 14b held by the second holding section 74 of the tray holding apparatus 62 into the first cutting apparatus 6, the first transfer unit 46 is moved toward the front in the Y-axis direction in FIG. 5. Then, the annular frame F of the wafer unit 17 is gripped by the grip section 52 as illustrated in FIGS. 8 and 9, and the first transfer unit 46 is moved toward the back in the Y-axis direction, thus drawing out the wafer unit 17 onto the first centering bars 58 for cutting of the wafer 11 with the first cutting apparatus 6 as illustrated in FIG. 5.

The workings of the tray holding apparatuses 62 opposed to the second cutting apparatus 6A and the die bonder 10 are the same as those of the tray holding apparatus 62 opposed to the first cutting apparatus 6. Therefore, the description thereof will be omitted.

Figure 10:
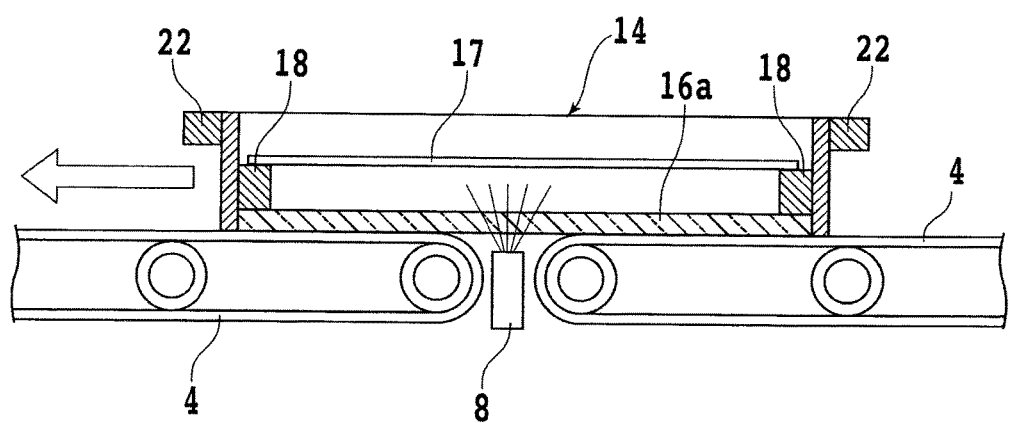
FIG. 10 is a sectional view illustrating the manner in which the wafer unit, accommodated in the tray and transferred by the conveyor, is irradiated with ultraviolet radiation.

On the other hand, if the dicing tape T of the wafer unit 17 is an ultraviolet curing tape (UV tape), and if the tackiness of the tape should be reduced, and because the UV irradiator 8, the third apparatus, can move reciprocally in the direction shown by an arrow B, the UV irradiator 8 is moved to immediately under the transfer path of the conveyor 4 as illustrated in FIG. 10 when it is determined, on the basis of information in the barcode 19 affixed to the wafer 11 read by the barcode reader 64, that the dicing tape T is a UV tape.

In the case of the present embodiment, the bottom plate 16a of the tray 14 is formed with a transparent resin such as polycarbonate. The wafer unit 17 is irradiated with ultraviolet radiation from the UV irradiator 8, thus curing the dicing tape T of the wafer unit 17 and reducing the tackiness of the tape. This makes it possible to easily pick up the device chips with a pickup apparatus in a pickup step at a later time. Alternatively, the UV irradiator 8 may be installed permanently immediately under the transfer path of the conveyor 4. Still alternatively, the UV irradiator 8 may include the first transfer unit 46 so that the wafer units 17 are unloaded from or loaded into the tray holding apparatus 62 provided for the UV irradiator 8.

It should be noted that although not specifically shown, in FIG. 1 that illustrates the overall configuration of the wafer processing system 2, a testing step should preferably be included in the processes performed by the wafer processing system. In this case, it is only necessary to arrange a testing apparatus along the transfer path of the conveyor 4.

In the wafer processing system according to the embodiment described above, the wafers 11 are placed into the trays 14 and transferred one at a time by the conveyor 4, and the wafer's 11 are temporarily placed into the tray holding apparatus 62 first, and then supplied each machining apparatus, providing maximum reduction in useless wait time and permitting efficient processing of wafers with a small number of operators. Further, the wafers 11 are placed into the trays 14 and transferred by the conveyor 4, preventing wafer damage and other inconvenience during transfer.

Although each of the tray holding apparatuses 62 has two tray holding sections or the first and second holding sections 72 and 74 in the above embodiment, only one tray holding section may be provided. In this case, a single tray 14 transferred by the conveyor 4 is held by the tray holding apparatus. After the wafer is loaded into the machining apparatus, the empty tray 14 is fed back onto the conveyor 4. Then, the next tray 14 is held by the tray holding apparatus, and the second wafer 11 is loaded into the machining apparatus and put on standby inside the machining apparatus. This allows for efficient exchange of wafers inside the apparatus (makes it possible for the chuck table 30 to hold the unmachined wafer 11 immediately after the machined wafer 11 has been removed from the chuck table 30).

If the tray holding apparatus has the first tray holding section 72 and the second tray holding section 74 as does the tray holding apparatus 62 of the present embodiment, one of the first and second tray holding sections 72 and 74 basically continues to hold one empty tray 14. Therefore, even if there is no supply of the trays 14 by the conveyor 4, the tray 14 for accommodating the machined wafer 11 is available, thus making it possible to feed the wafer 11 back onto the conveyor 4.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing system for processing wafers one at a time, the wafer processing system comprising:
   a plurality of trays each configured to accommodate a wafer;
   a conveyor configured to transfer the wafers accommodated in the trays;
   first and second tray holding apparatuses arranged to be spaced from each other along the conveyor, the first and second tray holding apparatuses unloading the trays from the conveyor and loading the unloaded trays onto the conveyor;
   first and second apparatuses provided for the first and second tray holding apparatuses, respectively, the first and second apparatuses including processing means configured to process the wafers transferred by the conveyor, and loading/unloading means configured to unload a wafer from or load a wafer onto one of the trays that is held by the first or second tray holding apparatus; and
   a pair of rail members, with one of said rail members formed on each side of the conveyor, wherein each of said rail members includes first and second accommodation grooves therein, and further wherein said pair of first accommodation grooves are configured and arranged to accommodate downward movement of said first tray holding apparatus and said pair of second accommodation grooves are configured and arranged to accommodate downward movement of said second tray holding apparatus.

2. The wafer processing system of claim 1,
   wherein each of the first and second tray holding apparatuses has a first tray holding section configured to hold the tray and a second tray holding section configured to hold the tray, and
   the second tray holding section can unload or load one of the trays onto or from the conveyor while at the same time the first tray holding section is holding another tray.

3. The wafer processing system of claim 1,
   wherein processes performed by the processing means include machining and testing of the wafers.

4. The wafer processing system of claim 1, wherein:
   the first and second tray holding apparatuses each include an upper holding section and a lower holding section; and
   the upper and lower holding sections are each configured and arranged to slidably receive and support one of said trays via lateral protruding portions thereof.

5. A wafer processing system for processing wafers one at a time, the wafer processing system comprising:
   a plurality of trays each configured to accommodate a wafer;
   a conveyor configured to transfer the wafers accommodated in the trays;
   first and second tray holding apparatuses arranged to be spaced from each other along the conveyor, the first and second tray holding apparatuses unloading the trays from the conveyor and loading the unloaded trays onto the conveyor; and
   first and second apparatuses provided for the first and second tray holding apparatuses, respectively, the first and second apparatuses including processing means configured to process the wafers transferred by the conveyor, and loading/unloading means configured to unload a wafer from or load a wafer onto one of the trays that is held by the first or second tray holding apparatus, and wherein the first tray holding apparatus is configured and arranged to be raised and lowered with respect to the conveyor, and further wherein when the first tray holding apparatus is in an uppermost position, sufficient space is provided between the first tray holding apparatus and the conveyor to enable a tray positioned on the conveyor to pass below the first tray holding apparatus without interference from the first tray holding apparatus or any tray held therein.

6. The wafer processing system of claim 5, wherein each of the first and second tray holding apparatuses has a first tray holding section configured to hold the tray and a second tray holding section configured to hold the tray, and the second tray holding section can unload or load one of the trays onto or from the conveyor while at the same time the first tray holding section is holding another tray.

7. The wafer processing system of claim 5, wherein processes performed by the processing means include machining and testing of the wafers.

8. The wafer processing system of claim 5, wherein:

the first and second tray holding apparatuses each include an upper holding section and a lower holding section; and the upper and lower holding sections are each configured and arranged to slidably receive and support one of said trays via lateral protruding portions thereof.

* * * * *